(12) United States Patent
Kondo et al.

(10) Patent No.: US 12,424,500 B2
(45) Date of Patent: Sep. 23, 2025

(54) SEMICONDUCTOR DEVICE AND METHOD FOR MANUFACTURING SEMICONDUCTOR DEVICE

(71) Applicant: Mitsubishi Electric Corporation, Tokyo (JP)

(72) Inventors: Katsuhiko Kondo, Tokyo (JP); Taishi Sasaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 404 days.

(21) Appl. No.: 18/043,828

(22) PCT Filed: Jan. 22, 2021

(86) PCT No.: PCT/JP2021/002281
§ 371 (c)(1),
(2) Date: Mar. 2, 2023

(87) PCT Pub. No.: WO2022/157934
PCT Pub. Date: Jul. 28, 2022

(65) Prior Publication Data
US 2023/0352354 A1    Nov. 2, 2023

(51) Int. Cl.
*H01L 23/13* (2006.01)
*H01L 23/473* (2006.01)
(Continued)

(52) U.S. Cl.
CPC ............ *H01L 23/13* (2013.01); *H01L 23/473* (2013.01); *H01L 25/0655* (2013.01); *H01L 25/50* (2013.01)

(58) Field of Classification Search
CPC ....... H01L 23/367; H01L 23/34; H01L 23/12; H01L 23/32; H01L 23/13; H01L 23/16;
(Continued)

(56) References Cited

U.S. PATENT DOCUMENTS

| 2005/0084704 A1* | 4/2005 | Osanai ............ H01L 23/13 257/E23.106 |
| 2005/0103473 A1* | 5/2005 | Todd .................. F28F 1/32 165/104.11 |

(Continued)

FOREIGN PATENT DOCUMENTS

| JP | S51-112279 A | 10/1976 |
| JP | H08-083872 A | 3/1996 |
| JP | 2015-073012 A | 4/2015 |

OTHER PUBLICATIONS

International Search Report issued in PCT/JP2021/002281; mailed Apr. 13, 2021.

*Primary Examiner* — Sophia T Nguyen
(74) *Attorney, Agent, or Firm* — Studebaker Brackett PLLC

(57) ABSTRACT

A semiconductor device according to the first disclosure includes a base plate that has an upper surface and a back surface on a side opposite the upper surface and at the back surface of which an annular groove is formed, a substrate provided on the upper surface of the base plate and a semiconductor chip provided on an upper surface of the substrate, wherein the base plate has a convex warping part that warps in a convex shape toward the upper surface side, and a part of the groove, which is formed at the convex warping part is deeper at a position farther away from a maximum warping part having a largest warp in the convex warping part.

21 Claims, 11 Drawing Sheets

(51) Int. Cl.
*H01L 25/00* (2006.01)
*H01L 25/065* (2023.01)

(58) Field of Classification Search
CPC . H01L 23/3675; H01L 23/40; H01L 23/4006; H01L 2023/4075; H01L 2023/4087
See application file for complete search history.

(56) References Cited

U.S. PATENT DOCUMENTS

| | | | | |
|---|---|---|---|---|
| 2011/0316035 | A1* | 12/2011 | Shin | H05K 1/05 |
| | | | | 257/E33.056 |
| 2013/0285234 | A1* | 10/2013 | Uhlemann | H01L 23/473 |
| | | | | 257/782 |
| 2015/0097281 | A1* | 4/2015 | Adachi | H01L 23/473 |
| | | | | 257/714 |
| 2016/0322274 | A1* | 11/2016 | Takizawa | H01L 25/07 |
| 2016/0336255 | A1* | 11/2016 | Miyawaki | H01L 23/13 |
| 2019/0067154 | A1* | 2/2019 | Yoshihara | H01L 25/18 |
| 2019/0111467 | A1* | 4/2019 | Tanaka | H01L 23/3736 |
| 2019/0164858 | A1* | 5/2019 | Koyanagi | H01L 25/18 |
| 2019/0350078 | A1* | 11/2019 | Wakabayashi | B22D 19/02 |
| 2019/0371688 | A1* | 12/2019 | Saito | H01L 23/142 |
| 2020/0194329 | A1* | 6/2020 | Itoh | H01L 23/473 |
| 2020/0219782 | A1* | 7/2020 | Hitomi | H01L 21/4817 |
| 2022/0278004 | A1* | 9/2022 | Sannai | H01L 25/072 |
| 2022/0293553 | A1* | 9/2022 | Nishino | C04B 37/026 |
| 2023/0352354 | A1* | 11/2023 | Kondo | H01L 25/50 |

* cited by examiner

SEMICONDUCTOR DEVICE AND METHOD FOR MANUFACTURING SEMICONDUCTOR DEVICE

FIELD

The present disclosure relates to a semiconductor device and a method for manufacturing the semiconductor device.

BACKGROUND

PTL 1 discloses a semiconductor device including a semiconductor chip, an insulating substrate having a principal surface to which a semiconductor chip is joined, and a base having a principal surface to which another principal surface of the insulating substrate is joined. A convex part is provided at another principal surface of the base, and an annular groove is provided at the outer periphery of the convex part. A sealing material made of an annular elastic body is inserted along the groove. A case having an opening is positioned such that the outer edge of the opening contacts the sealing material.

CITATION LIST

Patent Literature

[PTL 1] JP 2015-73012 A

SUMMARY

Technical Problem

In the semiconductor device as disclosed in PTL 1, leakage of cooling water is prevented by sandwiching the sealing material between a base plate and a cooler to ensure a sufficient amount of deformation. The amount of deformation of the sealing material is obtained through load application to the sealing material when the base plate is fixed to the cooler. In this case, when a load is not uniformly applied across the entire circumference of the sealing material, variance in the amount of deformation occurs, which potentially causes leakage of cooling water. Furthermore, a member potentially cracks by compression. In particular, clearance between the base plate and the cooler is not uniform depending on the warping shape of a contact surface of the base plate or the cooler with the sealing material, which potentially causes variance in the amount of deformation of the sealing material.

The present disclosure is intended to obtain a semiconductor device that can reduce variance in the amount of deformation of a sealing material and a method for manufacturing the semiconductor device.

Solution to Problem

A semiconductor device according to the first disclosure includes a base plate that has an upper surface and a back surface on a side opposite the upper surface and at the back surface of which an annular groove is formed, a substrate provided on the upper surface of the base plate and a semiconductor chip provided on an upper surface of the substrate, wherein the base plate has a convex warping part that warps in a convex shape toward the upper surface side, and a part of the groove, which is formed at the convex warping part is deeper at a position farther away from a maximum warping part having a largest warp in the convex warping part.

A semiconductor device according to the second disclosure includes a base plate that has an upper surface and a back surface on a side opposite the upper surface and at the back surface of which an annular groove is formed, a substrate provided on the upper surface of the base plate and a semiconductor chip provided on an upper surface of the substrate, wherein the base plate has a concave warping part, the concave warping part warping in a convex shape toward the back surface side, and a part of the groove, which is formed at the concave warping part, has a constant depth.

A semiconductor device according to the third disclosure includes a base plate that has an upper surface and a back surface on a side opposite the upper surface and at the back surface of which an annular groove is formed, a substrate provided on the upper surface of the base plate, a semiconductor chip provided on an upper surface of the substrate, a sealing material housed in the groove and a cooler fixed to the back surface of the base plate to cover the groove, wherein the base plate has a stress generated part at which stress is generated in a direction that warps the base plate in a convex shape toward the back surface side, and a part of the groove, which is formed at the stress generated part, has a constant depth.

A method for manufacturing a semiconductor device according to the fourth disclosure includes mounting a substrate on an upper surface of a base plate that has the upper surface and a back surface on a side opposite the upper surface and at the back surface of which an annular groove is formed, mounting a semiconductor chip on an upper surface of the substrate; and reducing warping of a concave warping part by fixing a cooler to the back surface of the base plate to cover the groove in a state in which the base plate has the concave warping part and a sealing material is housed in the groove, the concave warping part warping in a convex shape toward the back surface side, wherein a part of the groove, which is formed at the concave warping part, has a constant depth.

Advantageous Effects of Invention

In the semiconductor device and the method for manufacturing the semiconductor device according to the present disclosure, the depth of a groove is set in accordance with the direction of warping of a base plate. Thus, variance in the amount of deformation of a sealing material is reduced.

DESCRIPTION OF EMBODIMENTS

Figure 1:
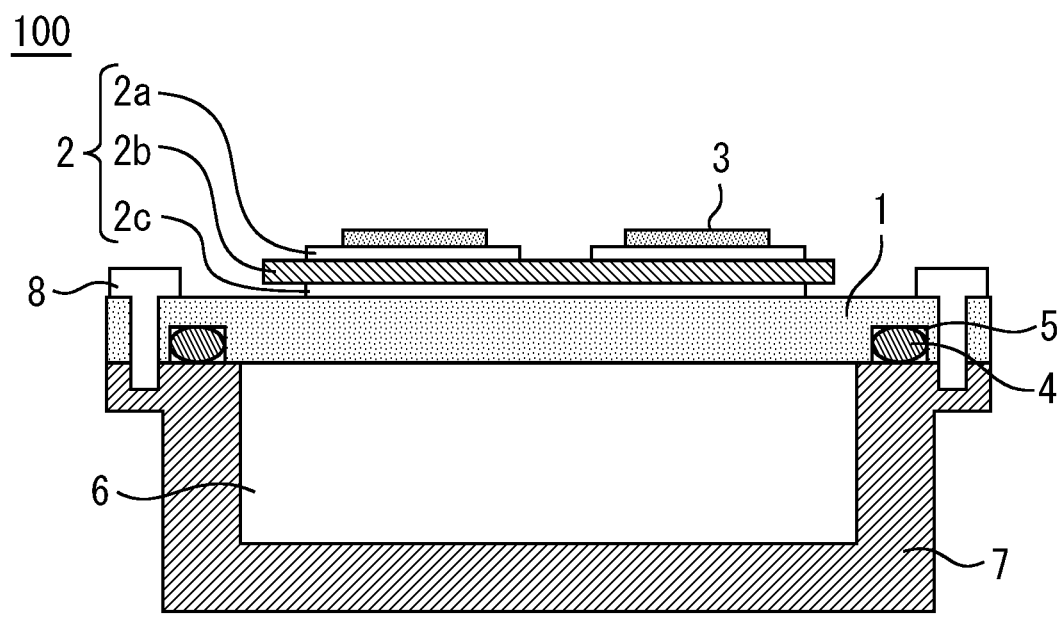
FIG. 1 is a cross-sectional view of a semiconductor device according to Embodiment 1.

A semiconductor device and a method for manufacturing a semiconductor device according to each embodiment are described with reference to drawings. Identical or corresponding constitutional elements are given the same reference numerals, and the repeated description of such constitutional elements may be omitted.

Embodiment 1

Figure 2:
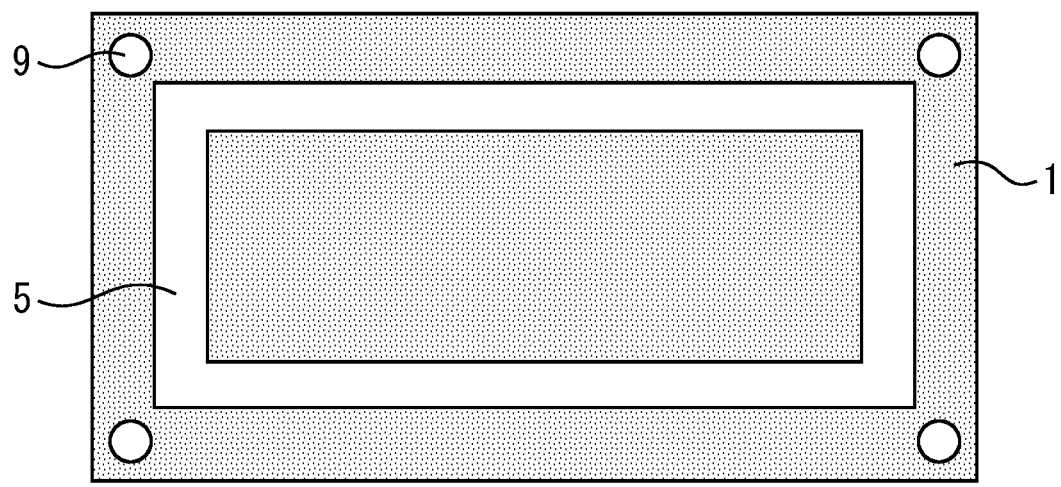
FIG. 2 is a bottom view of the base plate according to Embodiment 1.

FIG. 1 is a cross-sectional view of a semiconductor device 100 according to Embodiment 1. The semiconductor device 100 includes a base plate 1, a substrate 2 provided on an upper surface of the base plate 1, and a semiconductor chip 3 provided on an upper surface of the substrate 2. FIG. 2 is a bottom view of the base plate 1 according to Embodiment 1. The base plate 1 has the upper surface and a back surface on a side opposite the upper surface, and an annular groove 5 is formed at the back surface. The groove 5 is rectangular in a plan view.

A sealing material 4 is housed in the groove 5. A cooler 7 is fixed to the back surface of the base plate 1. An outer edge part of the cooler 7 covers the groove 5. The cooler 7 holds cooling water 6. The base plate 1 is fastened to the cooler 7 by a fastening member 8. The cooling water 6 can be sealed when the base plate 1 is fixed to the cooler 7 through the sealing material 4.

The semiconductor chip 3 is, for example, a power semiconductor chip. The semiconductor chip 3 is, for example, an insulated gate bipolar transistor (IGBT), a metal-oxide-semiconductor field-effect transistor (MOSFET), or a diode. The power semiconductor chip potentially reaches high temperature during operation, and thus it is important to obtain a high heat-releasing property. The semiconductor chip 3 is made with, for example, Si. The semiconductor chip 3 may be made with a wide-bandgap semiconductor. The wide-bandgap semiconductor is, for example, silicon carbide, gallium nitride material, or diamond. When made with the wide-bandgap semiconductor, the semiconductor chip 3 can be operated at high temperature. Thus, it is particularly important to obtain a high heat-releasing property. Although two semiconductor chips 3 are illustrated in FIG. 1, the number of semiconductor chips 3 included in the semiconductor device 100 may be equal to or larger than one.

The substrate 2 is, for example, an insulating substrate. The substrate 2 is constituted by a front-surface circuit pattern 2a, a ceramic substrate 2b, and a back-surface circuit pattern 2c. The ceramic substrate 2b is formed of ceramic such as Al2O3, AlN, or Si3N4. The front-surface circuit pattern 2a and the back-surface circuit pattern 2c are formed of metal containing, for example, Cu as a primary component. The front-surface circuit pattern 2a and the back-surface circuit pattern 2c are formed on upper and back surfaces, respectively, of the ceramic substrate 2b. The front-surface circuit pattern 2a is selectively formed on the upper surface of the ceramic substrate 2b. Accordingly, circuits are formed on the upper surface of the ceramic substrate 2b.

A back-surface electrode of at least one semiconductor chip 3 is joined to an upper surface of the front-surface circuit pattern 2a. The back-surface electrode is, for example, a collector electrode. The semiconductor chip 3 is connected to the front-surface circuit pattern 2a through a junction material. The junction material is lead-free solder such as Sn—Ag solder. Various wires are formed on a front-surface electrode of the semiconductor chip 3 with bonding wires, metal plates, or the like. The front-surface electrode is, for example, an emitter electrode or a gate electrode. With the above-described configuration, circuits necessary for the semiconductor device 100 are formed. Circumference of the semiconductor chip 3 is protected by an outer frame, a lid, sealing resin, or the like, which are not illustrated.

The base plate 1 has a plate shape. The base plate 1 is formed of a metallic material such as copper or a copper alloy. The back-surface circuit pattern 2c of the substrate 2 is joined to the base plate 1 through a junction material. The junction material is lead-free solder such as Sn—Ag solder.

With the above-described configuration, heat generated from each semiconductor chip 3 during operation of the semiconductor device 100 is efficiently transferred to the cooling water 6 and a high heat-releasing characteristic is obtained. The back surface of the base plate 1 may be provided with a convex part such as a fin. Accordingly, the area of contact between the base plate 1 and the cooling water 6 is increased and the heat-releasing characteristic is further improved.

The cooler 7 has a box shape and has an opening. The cooler 7 has a function to supply the cooling water 6 to the semiconductor device 100 and hold the cooling water 6. The cooler 7 is formed of a metallic material such as Al or an Al alloy. Accordingly, durability of the cooler 7 that holds the cooling water 6 is obtained. The cooler 7 also has a supply port and a discharge port, which are not illustrated, for circulating the cooling water 6 to and from an external heat-releasing device.

The sealing material 4 is an annular elastic body formed of for example, a rubber material. The sealing material 4 is, for example, an O-ring. The sealing material 4 is inserted into the groove 5 between the base plate 1 and the cooler 7. Through-holes 9 are formed at the four corners of the base plate 1 outside the groove 5. The fastening members 8 such as bolts are inserted into the through-holes 9. Accordingly, the base plate 1 is held in a state of being pressed toward the cooler 7. In this case, the sealing material 4 closely contacts a part of the base plate 1 where the groove 5 is formed and the cooler 7 while exerting elastic force. Accordingly, the entire gap between the base plate 1 and the cooler 7 can be filled with the sealing material 4. Thus, external leakage of the cooling water 6 can be prevented. Such a cooling method is also called a direct cooling scheme.

Figure 3:
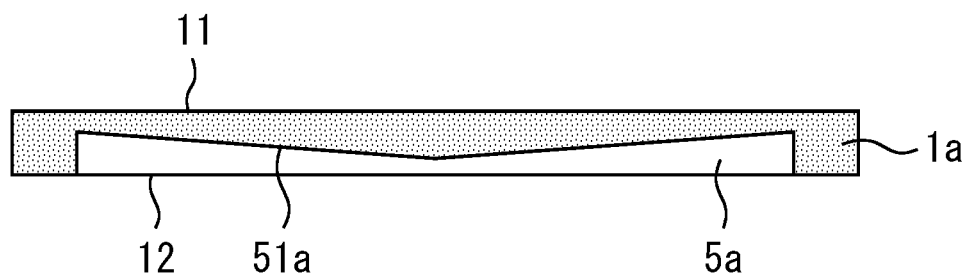
FIG. 3 is a cross-sectional view of a state in which no warping occurs to the base plate according to Embodiment 1.
Figure 4:
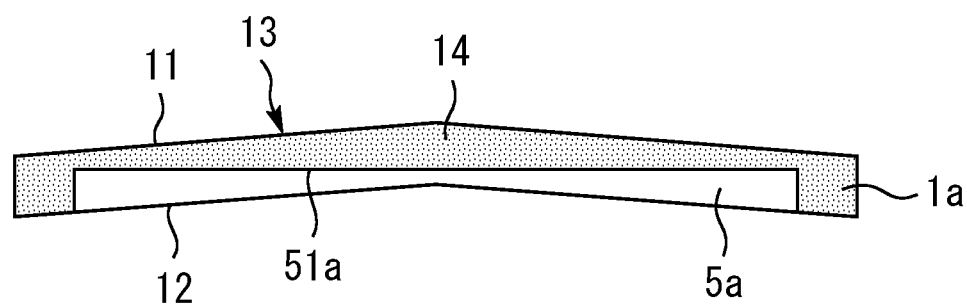
FIG. 4 is a cross-sectional view of a state in which warping occurs to the base plate according to Embodiment 1.

A base plate 1a in which a groove 5a is formed will be described below as a specific exemplary structure of the base plate 1. FIG. 3 is a cross-sectional view of a state in which no warping occurs to the base plate 1a according to Embodiment 1. FIG. 4 is a cross-sectional view of a state in which warping occurs to the base plate 1a according to Embodiment 1. FIGS. 3 and 4 illustrate a section of the base plate 1a in a direction along one of four sides of the groove 5a. The depth of the groove 5a in the base plate 1a is larger at a position farther away from the center of the side of the groove 5a.

The depth of the groove 5a is ununiform in the state illustrated in FIG. 3 in which no warping occurs before assembly. The base plate 1a warps in a convex shape toward an upper surface 11 side due to thermal load or the like at assembly as illustrated in FIG. 4. In other words, the base plate 1a has a convex warping part 13 that warps in a convex shape toward the upper surface 11 side. A part of the groove 5a, which is formed at the convex warping part 13 is deeper at a position farther away from a maximum warping part 14 having the largest warp in the convex warping part 13. The depth of the groove 5a is a height from a back surface 12 of the base plate 1a to a bottom part 51a of the groove 5a. The maximum warping part 14 is a part at which the upper surface 11 of the base plate 1a protrudes most. The maximum warping part 14 in the present embodiment is formed at the center of one side of the groove 5a. At the part of the groove 5a formed at the convex warping part 13, the thickness between the bottom part 51a of the groove 5a and the upper surface 11 of the base plate 1a is smaller at a position farther away from the maximum warping part 14.

Figure 5:
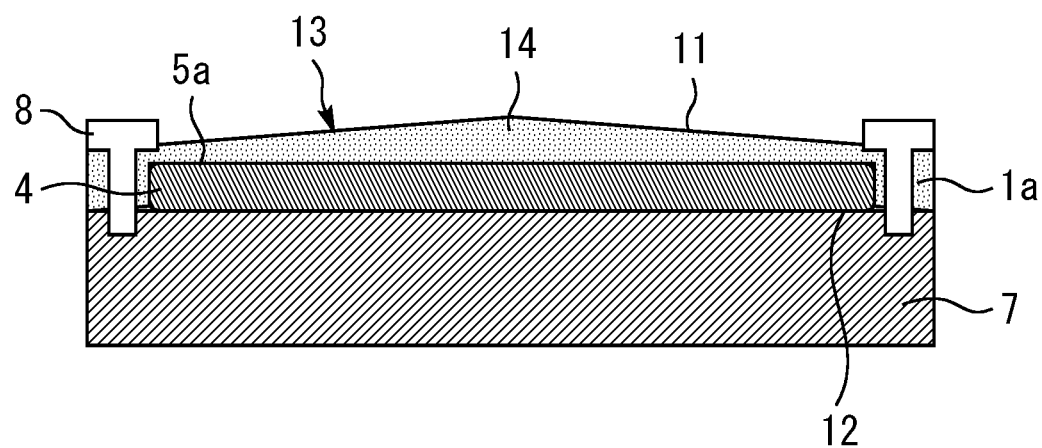
FIG. 5 is a cross-sectional view of a state in which the base plate according to Embodiment 1 is attached to the cooler.

FIG. 5 is a cross-sectional view of a state in which the base plate 1a according to Embodiment 1 is attached to the cooler 7. The difference in the depth of the groove 5a is canceled since the base plate 1a warps in a convex shape toward the upper surface 11 side. In other words, the height from the cooler 7 to the bottom part 51a of the groove 5a can be made uniform. Thus, variance in the amount of deformation of the sealing material 4 can be reduced.

The base plate 1a is fixed to the cooler 7 at an end part. Thus, force that corrects the warp is unlikely to act when the base plate 1a is fixed to the cooler 7. Accordingly, the shape of the groove 5a illustrated in FIG. 4 can be held in the state illustrated in FIG. 5 in which the base plate 1a is attached to the cooler 7. Thus, variance in the amount of deformation of the sealing material 4 can be reduced. Accordingly, leakage of the cooling water 6 and compression crack of members can be prevented.

For example, a case is assumed in which the depth of the groove is larger at a position closer to the end part of the base plate without consideration on the warping shape of the base plate. In this case, a part where the amount of deformation of the sealing material is insufficient or a part where the amount of deformation is excessive is potentially generated depending on the direction of warping. Leakage of the cooling water potentially occurs at the part where the amount of deformation is insufficient. Compression crack of members potentially occurs at the part where the amount of deformation is excessive. In the present embodiment, the depth of the groove 5 is set in accordance with the direction of warping of the base plate 1. Thus, variance in the amount of deformation of the sealing material 4 can be reliably reduced.

The bottom part 51a at the part of the groove 5a formed at the convex warping part 13 is formed as a flat surface. Accordingly, the sealing material 4 can be uniformly deformed by the flat surface. In addition, as illustrated in FIG. 4, the bottom part 51a of the groove 5a to which warping has occurred can be one flat surface. Accordingly, the sealing material 4 can be more uniformly deformed.

Note that the bottom part 51a of the groove 5a to which warping has occurred does not necessarily need to be one flat surface, and the height from the cooler 7 to the bottom part 51a of the groove 5a does not necessarily need to be completely uniform. The height from the cooler 7 to the bottom part 51a of the groove 5a may be different at positions as long as leakage of the cooling water can be prevented.

The structure illustrated in FIGS. 4 and 5 only needs to be formed at at least one of the four sides of the groove 5a. Specifically, at least one side of the groove 5a, which is formed at the convex warping part 13 needs to be deeper at a position farther away from the maximum warping part 14. The groove 5a may be polygonal, elliptical, or circular in a plan view.

The method for fixation of the base plate 1 and the cooler 7 is not limited to fastening with bolts. The base plate 1 and the cooler 7 may be fitted to each other. The base plate 1 only needs to be fixed in a state of being pressed toward the cooler 7.

These modifications can be applied, as appropriate, to semiconductor devices and method s for manufacturing the semiconductor devices according to the following embodiments. Note that the semiconductor devices and the methods for manufacturing the semiconductor devices according to the following embodiments are similar to those of the first embodiment in many respects, and thus differences between the semiconductor devices and the methods for manufacturing the semiconductor devices according to the following embodiments and those of the first embodiment will be mainly described below.

Embodiment 2

Figure 6:
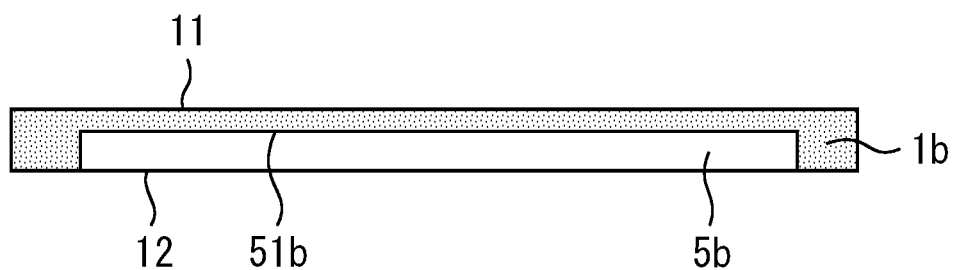
FIG. 6 is a cross-sectional view of a state in which no warping occurs to a base plate according to Embodiment 2.
Figure 7:
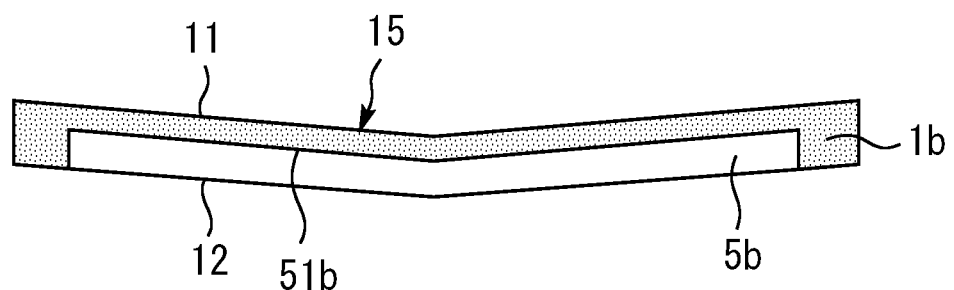
FIG. 7 is a cross-sectional view of a state in which warping occurs to the base plate according to Embodiment 2.

FIG. 6 is a cross-sectional view of a state in which no warping occurs to a base plate 1b according to Embodiment 2. FIG. 7 is a cross-sectional view of a state in which warping occurs to the base plate 1b according to Embodiment 2. In the present embodiment, the base plate 1b has a different structure and a different direction of warping from those in Embodiment 1. The depth of a groove 5b of the base plate 1b in the present embodiment is constant.

The depth of the groove 5b is uniform in the state illustrated in FIG. 6 in which no warping occurs before assembly. The base plate 1b warps in a convex shape toward the back surface 12 side due to thermal load or the like at assembly as illustrated in FIG. 7. In other words, the base plate 1b has a concave warping part 15, which warps in a convex shape toward the back surface 12 side. A part of the groove 5b, which is formed at the concave warping part 15, has a constant depth.

A method for manufacturing the semiconductor device according to the present embodiment will be described below. First, each semiconductor chip 3 is mounted on the upper surface of the substrate 2. In addition, the substrate 2 is mounted on the upper surface of the base plate 1b. Subsequently, in a state in which the base plate 1b has the concave warping part 15 and the sealing material 4 is housed in the groove 5b, the cooler 7 is fixed to the back surface 12 of the base plate 1b to cover the groove 5b. Accordingly, warping of the concave warping part 15 is reduced as compared to the state before fixation with the cooler 7. Note that the order of assembly of the substrate 2, the semiconductor chip 3, the base plate 1b, the sealing material 4, and the cooler 7 may be changed.

Figure 8:
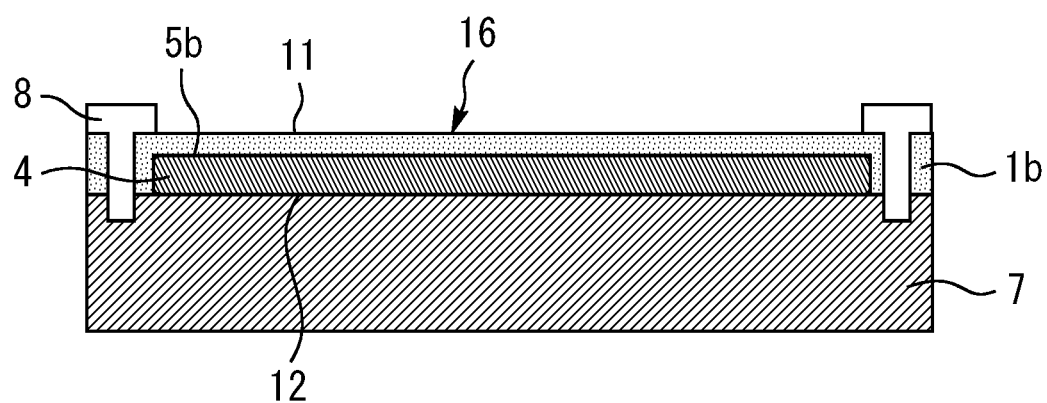
FIG. 8 is a cross-sectional view of a state in which the base plate according to Embodiment 2 is attached to the cooler.

FIG. 8 is a cross-sectional view of a state in which the base plate 1b according to Embodiment 2 is attached to the cooler 7. The base plate 1b is fixed to the cooler 7 at an end part. Thus, force that corrects the warp is likely to act when the base plate 1b is fixed to the cooler 7. Accordingly, in the state illustrated in FIG. 8 in which the base plate 1b is attached to the cooler 7, the groove 5b has a shape substantially equivalent to that in the state illustrated in FIG. 6 in which no warping occurs. Thus, the height from the cooler 7 to a bottom part 51b of the groove 5b can be uniform, and variance in the amount of deformation of the sealing material 4 can be reduced.

In the state illustrated in FIG. 8, stress is generated on the base plate 1b in a direction that causes warping of the base plate 1b in a convex shape toward the back surface 12 side. In other words, the base plate 1b has a stress generated part 16 at which stress is generated in the direction that causes warping of the base plate 1b in a convex shape toward the back surface 12 side. A part of the groove 5b, which is formed at the stress generated part 16, has a constant depth.

The bottom part 51b of the groove 5b in the present embodiment is a flat surface. The bottom part 51b of the groove 5b is not limited thereto but may have a curved surface or may have irregularities. Moreover, the height from the cooler 7 to the bottom part 51b of the groove 5b does not necessarily need to be completely uniform in the state in which the base plate 1b is attached to the cooler 7.

Embodiment 3

Figure 9:
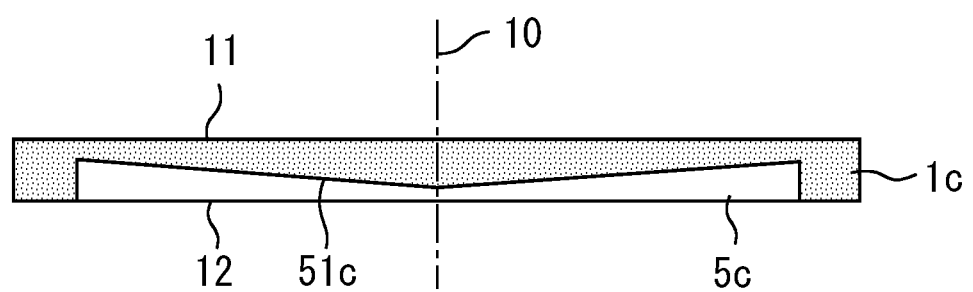
FIG. 9 is a cross-sectional view of a state in which no warping occurs to a base plate according to Embodiment 3.
Figure 10:
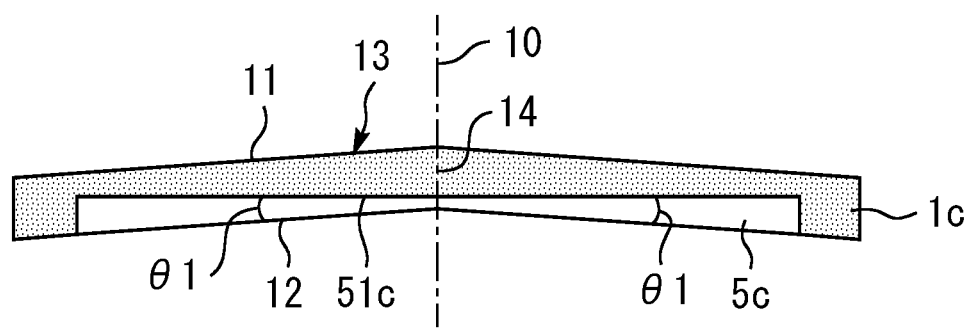
FIG. 10 is a cross-sectional view of a state in which warping occurs to the base plate according to Embodiment 3.

FIG. 9 is a cross-sectional view of a state in which no warping occurs to a base plate 1c according to Embodiment 3. FIG. 10 is a cross-sectional view of a state in which warping occurs to the base plate 1c according to Embodiment 3. The base plate 1c has the convex warping part 13. As in Embodiment 1, a groove 5c of the base plate 1c is polygonal in a plan view. In addition, as in Embodiment 1, at least one side of the groove 5c, which is formed at the convex warping part 13 is deeper at a position closer to an end part of the one side. Moreover, the depth of the groove 5c along at least one side of the groove 5c, which is formed at the convex warping part 13 is symmetric with respect to a center 10 of the one side. An angle θ1 indicating the amount of change in the depth of the groove 5c is the same on both sides of the center 10. The angle θ1 is the angle between the back surface 12 of the base plate 1c and a bottom part 51c of the groove 5c in a sectional view.

With such a structure, at assembly to the cooler 7, the sealing material 4 can be reliably deformed at the center 10 of a side of the groove 5c on which the maximum warping part 14 of the base plate 1c is likely to be formed.

Embodiment 4.

Figure 11:
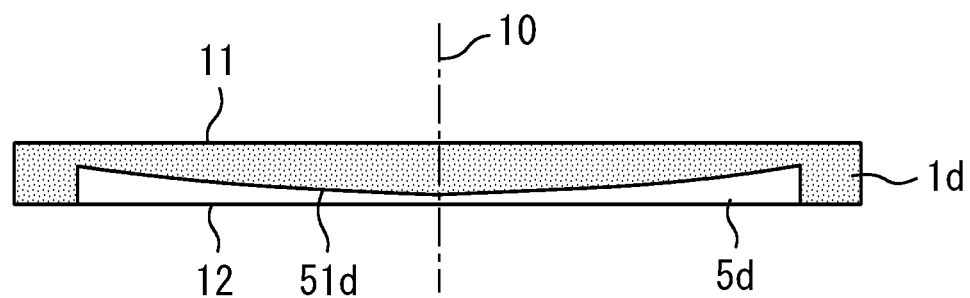
FIG. 11 is a cross-sectional view of a state in which no warping occurs to a base plate according to Embodiment 4.
Figure 12:
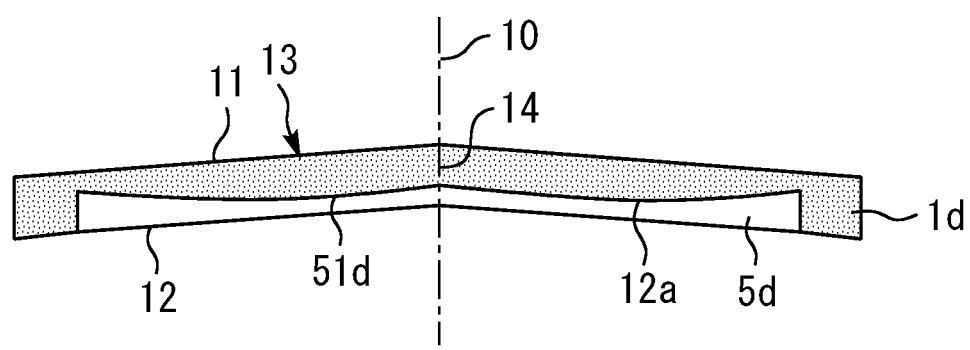
FIG. 12 is a cross-sectional view of a state in which warping occurs to the base plate according to Embodiment 4.

FIG. 11 is a cross-sectional view of a state in which no warping occurs to a base plate 1d according to Embodiment 4. FIG. 12 is a cross-sectional view of a state in which warping occurs to the base plate 1d according to Embodiment 4. In the present embodiment, the shape of a groove 5d of the base plate 1d is different from that in Embodiment 3. A part of the groove 5d, which is formed at the convex warping part 13 is deeper at a position farther away from the center 10. The depth of the groove 5d is symmetric with respect to the center 10. A bottom part 51d of the groove 5d at the part formed at the convex warping part 13 is formed as a curved surface. The shape of the bottom part 51d is the same on both sides of the center 10.

In the present embodiment as well, the groove 5d is shallower at a position closer to the center 10. Thus, at assembly to the cooler 7, the sealing material 4 can be reliably deformed at the center 10 of a side of the groove 5d on which the maximum warping part 14 of the base plate 1d is likely to be formed.

Moreover, in the present embodiment, the height from the cooler 7 to the bottom part 51d of the groove 5d is not completely uniform as illustrated in FIG. 12. However, in the present embodiment as well, the difference in the depth of the groove 5d is canceled since the base plate 1d warps in a convex shape toward the upper surface 11 side. Thus, variance in the amount of deformation of the sealing material 4 can be reduced.

Embodiment 5

Figure 13:
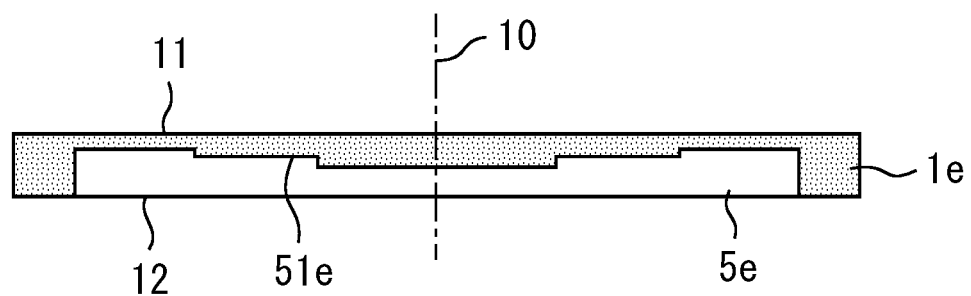
FIG. 13 is a cross-sectional view of a state in which no warping occurs to a base plate according to Embodiment 5.
Figure 14:
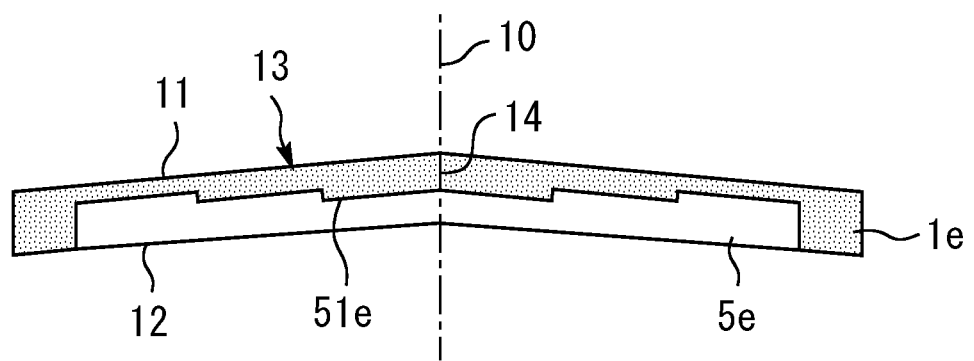
FIG. 14 is a cross-sectional view of a state in which warping occurs to the base plate according to Embodiment 5.

FIG. 13 is a cross-sectional view of a state in which no warping occurs to a base plate 1e according to Embodiment 5. FIG. 14 is a cross-sectional view of a state in which warping occurs to the base plate 1e according to Embodiment 5. In the present embodiment, the shape of a groove 5e of the base plate 1e is different from that in Embodiment 3. A part of the groove 5e, which is formed at the convex warping part 13 is deeper at a position farther away from the center 10. The depth of the groove 5e is symmetric with respect to the center 10. A bottom part 51e of the groove 5e at the part formed at the convex warping part 13 has a stepped shape.

In the present embodiment as well, the groove 5e is shallower at a position closer to the center 10. Thus, at assembly to the cooler 7, the sealing material 4 can be reliably deformed at the center 10 of a side of the groove 5e on which the maximum warping part 14 of the base plate 1c is likely to be formed.

Embodiment 6

Figure 15:
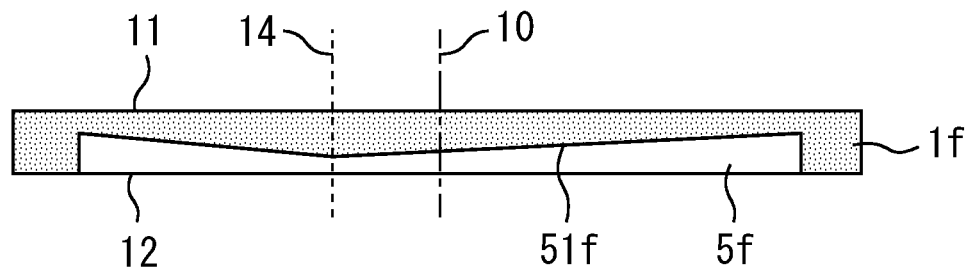
FIG. 15 is a cross-sectional view of a state in which no warping occurs to a base plate according to Embodiment 6.
Figure 16:
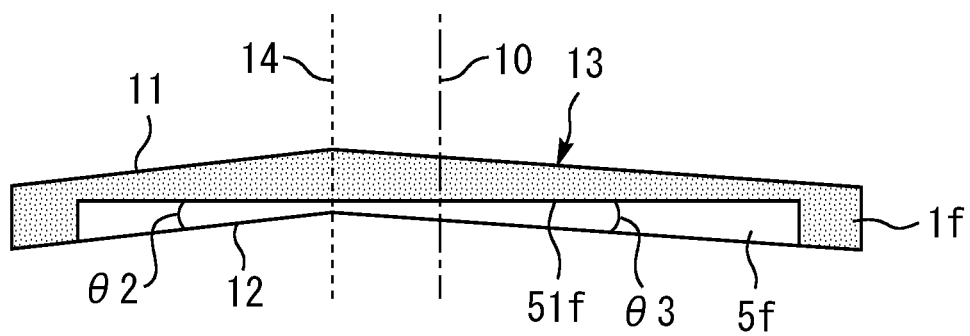
FIG. 16 is a cross-sectional view of a state in which warping occurs to the base plate according to Embodiment 6.
Figure 17:
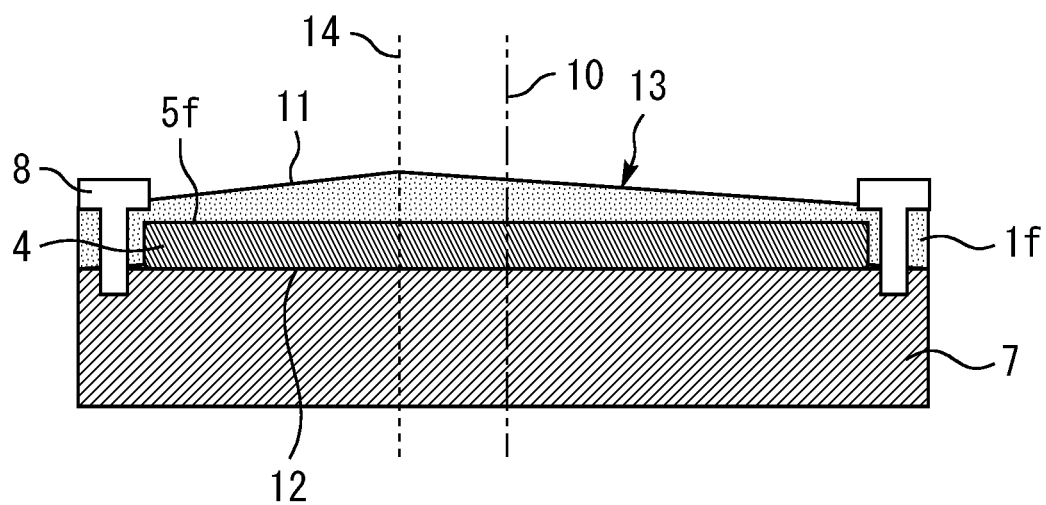
FIG. 17 is a cross-sectional view of a state in which the base plate according to Embodiment 6 is attached to the cooler.

FIG. 15 is a cross-sectional view of a state in which no warping occurs to a base plate 1f according to Embodiment 6. FIG. 16 is a cross-sectional view of a state in which warping occurs to the base plate 1f according to Embodiment 6. FIG. 17 is a cross-sectional view of a state in which the base plate 1f according to Embodiment 6 is attached to the cooler 7. In the present embodiment, the shape of a groove 5f of the base plate 1f is different from that in Embodiment 1. The base plate 1f has the convex warping part 13. As in Embodiment 1, the groove 5f of the base plate 1f is polygonal in a plan view. A part of the groove 5f, which is formed at the convex warping part 13 is deeper at a position farther away from the maximum warping part 14. A bottom part 51f of the groove 5f is formed as a flat surface.

The maximum warping part 14 in the present embodiment is provided at a position shifted from the center 10 of one side of the groove 5f, which is formed at the convex warping part 13, in a direction along the one side. Along the one side of the groove 5f formed at the convex warping part 13, the depth of the groove 5f largely changes at separation from the maximum warping part 14 by a certain distance on a side on which the distance from the maximum warping part 14 to an end part of the one side is shorter as compared to a side on which the distance from the maximum warping part 14 to an end part of the one side is longer. Accordingly, $\theta_2 > \theta_3$ holds. The depth of the groove 5f is equal at both end parts of the one side of the groove 5f formed at the convex warping part 13.

In this manner, as illustrated in FIG. 17, the height from the cooler 7 to the bottom part 51f of the groove 5f can be made uniform by setting the depth of the groove 5f in accordance with the convex warping shape of the base plate 1f. Thus, variance in the amount of deformation of the sealing material 4 is reduced.

Embodiment 7

Figure 18:
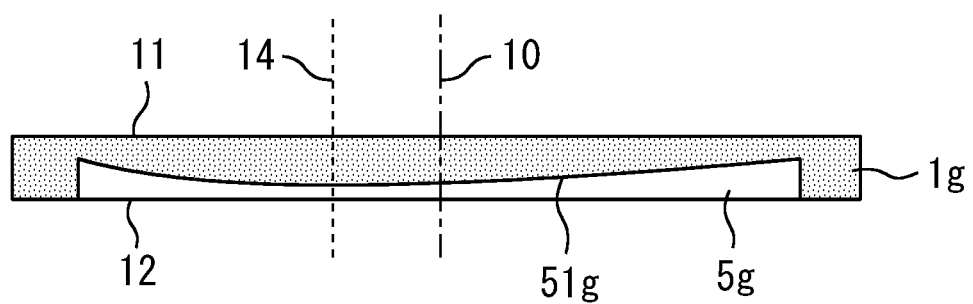
FIG. 18 is a cross-sectional view of a state in which no warping occurs to a base plate according to Embodiment 7.
Figure 19:
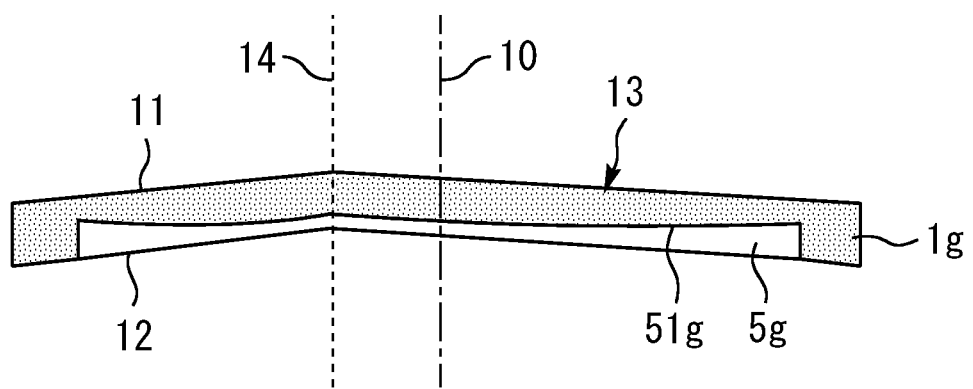
FIG. 19 is a cross-sectional view of a state in which warping occurs to the base plate according to Embodiment 7.

FIG. 18 is a cross-sectional view of a state in which no warping occurs to a base plate 1g according to Embodiment 7. FIG. 19 is a cross-sectional view of a state in which warping occurs to the base plate 1g according to Embodiment 7. In the present embodiment, the shape of a groove 5g of the base plate 1g is different from that in Embodiment 6. A bottom part 51g of the groove 5g is formed as a curved surface.

As in Embodiment 6, the maximum warping part 14 of the base plate 1g is provided at a position shifted from the center 10 of one side of the groove 5g, which is formed at the convex warping part 13, in a direction along the one side. Along the one side of the groove 5g formed at the convex warping part 13, the depth of the groove 5g largely changes at separation from the maximum warping part 14 by a constant distance on a side on which the distance from the maximum warping part 14 to an end part of the one side is shorter as compared to a side on which the distance from the maximum warping part 14 to an end part of the one side is longer. In other words, curvature is larger on the side on which the distance from the maximum warping part 14 to an end part of the side of the groove 5g is shorter as compared to the side on which the distance from the maximum warping part 14 to an end part of the side of the groove 5g is longer.

In the present embodiment as well, the sealing material 4 can be reliably deformed at the maximum warping part 14 by setting the depth of the groove 5g in accordance with the convex warping shape of the base plate 1g.

Embodiment 8

Figure 20:
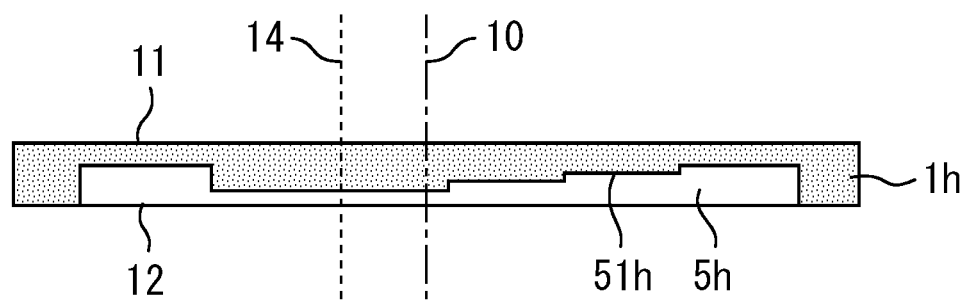
FIG. 20 is a cross-sectional view of a state in which no warping occurs to a base plate according to Embodiment 8.
Figure 21:
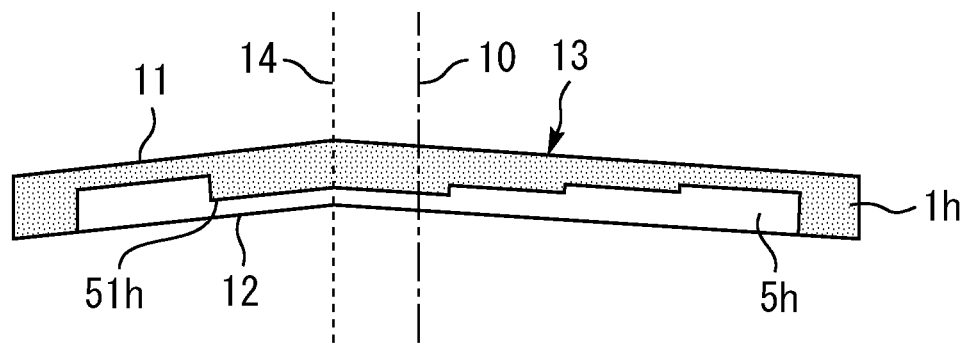
FIG. 21 is a cross-sectional view of a state in which warping occurs to the base plate according to Embodiment 8.

FIG. 20 is a cross-sectional view of a state in which no warping occurs to a base plate 1h according to Embodiment 8. FIG. 21 is a cross-sectional view of a state in which warping occurs to the base plate 1h according to Embodiment 8. In the present embodiment, the shape of a groove 5h of the base plate 1h is different from that in Embodiment 6. A bottom part 51h of the groove 5h has a stepped shape.

As in Embodiment 6, the maximum warping part 14 of the base plate 1h is provided at a position shifted from the center 10 of one side of the groove 5h, in which formed at the convex warping part 13, in a direction along the one side. Along the one side of the groove 5h formed at the convex warping part 13, the depth of the groove 5h largely changes at separation from the maximum warping part 14 by a constant distance on a side on which the distance from the maximum warping part 14 to an end part of the one side is shorter as compared to a side on which the distance from the maximum warping part 14 to an end part of the one side is longer.

In the present embodiment as well, the sealing material 4 can be reliably deformed at the maximum warping part 14 by setting the depth of the groove 5h in accordance with the convex warping shape of the base plate 1h.

Embodiment 9

Figure 22:
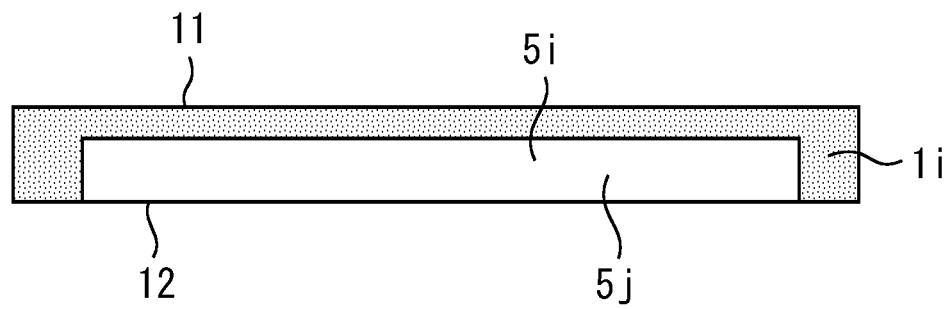
FIG. 22 is a cross-sectional view of a state in which no warping occurs to a base plate according to Embodiment 9.
Figure 23:
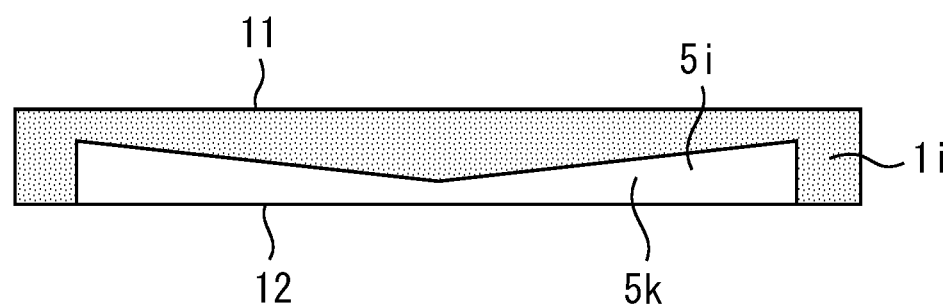
FIG. 23 is another cross-sectional view of the state in which no warping occurs to the base plate according to Embodiment 9.

FIG. 22 is a cross-sectional view of a state in which no warping occurs to a base plate 1i according to Embodiment 9. FIG. 23 is another cross-sectional view of the state in which no warping occurs to the base plate 1i according to Embodiment 9. In the present embodiment, the shape of a groove 5i of the base plate 1i is different from that in Embodiment 1. Grooves 5j and 5k illustrated in FIGS. 22 and 23 each serve as one side of the groove 5i according to the present embodiment. The depth of the groove 5j is constant. The groove 5k is deeper at a position farther away from the center of the groove 5k in a longitudinal direction of the groove 5k.

Figure 24:
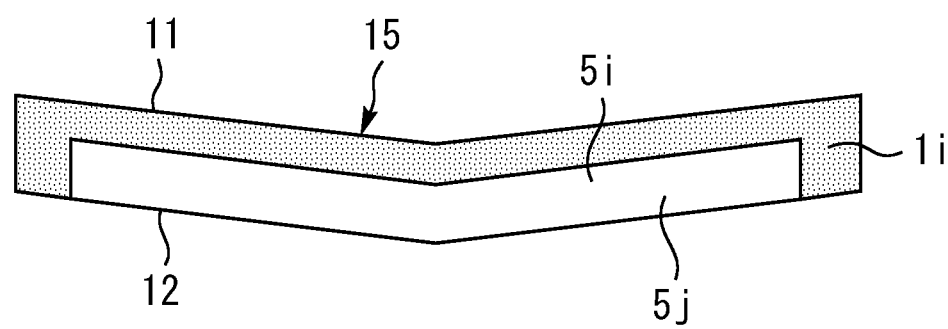
FIG. 24 is a cross-sectional view of a state in which warping occurs to the base plate according to Embodiment 9.
Figure 25:
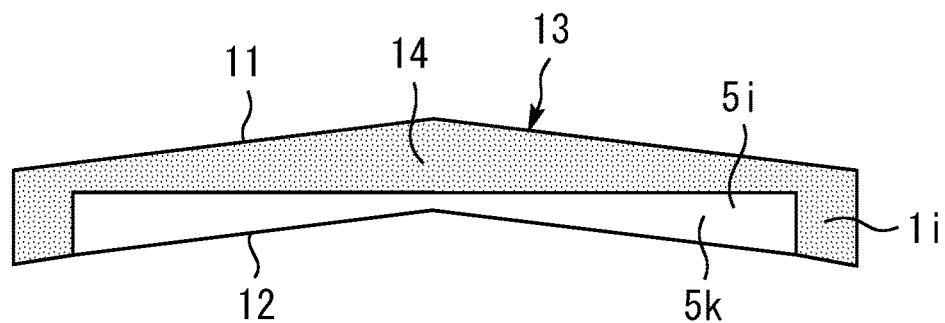
FIG. 25 is another cross-sectional view of the state in which warping occurs to the base plate according to Embodiment 9.

FIG. 24 is a cross-sectional view of a state in which warping occurs to the base plate 1i according to Embodiment 9. FIG. 25 is another cross-sectional view of the state in which warping occurs to the base plate 1i according to Embodiment 9. The groove 5j having the constant depth is formed at the concave warping part 15 of the base plate 1i. The groove 5k is formed at the convex warping part 13. The groove 5k is deeper at a position farther away from the maximum warping part 14. In this manner, the base plate 1i has the convex warping part 13 and the concave warping part 15 in mixture. The depth of the groove 5j is equal to the largest depth of the groove 5k at both end parts.

Figure 26:
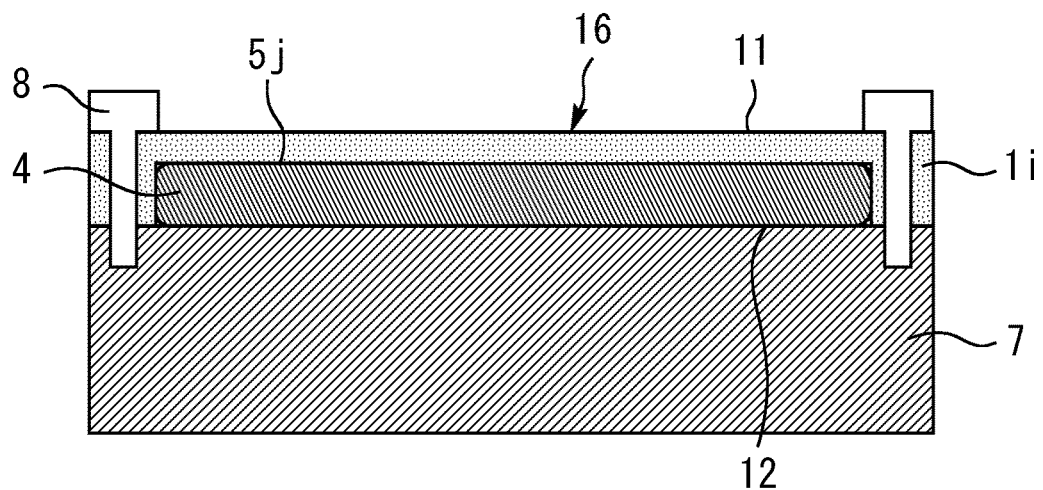
FIG. 26 is a cross-sectional view of a state in which the base plate according to Embodiment 9 is attached to the cooler.

FIG. 26 is a cross-sectional view of a state in which the base plate 1i according to Embodiment 9 is attached to the cooler 7. The base plate 1i is fixed to the cooler 7 at an end part. At the concave warping part 15, force that corrects the warp is likely to act when the base plate 1i is fixed to the cooler 7. Accordingly, in the state illustrated in FIG. 26, the groove 5j has a shape substantially equivalent to that in the state illustrated in FIG. 22 in which no warping occurs. Thus, the height from the cooler 7 to a bottom part of the groove 5j can be uniform, and variance in the amount of deformation of the sealing material 4 can be reduced.

In the state illustrated in FIG. 26, at a part of the base plate 1i at which the groove 5j is formed, stress is generated in a direction that causes warping of the base plate 1i in a convex shape toward the back surface 12 side. The groove 5j is formed at the stress generated part 16 of the base plate 1i at which stress is generated in the direction that causes warping of the base plate 1i in a convex shape toward the back surface 12 side.

Figure 27:
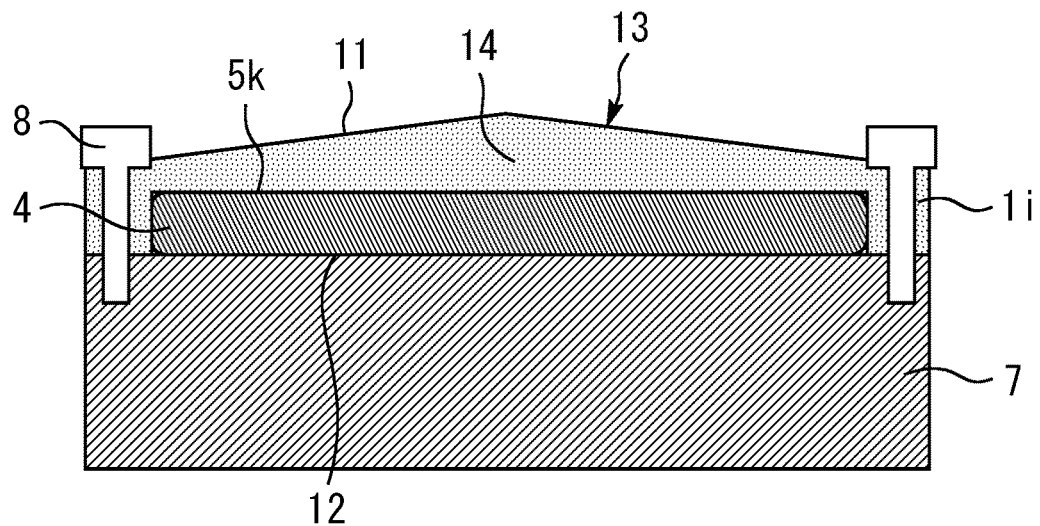
FIG. 27 is another cross-sectional view of the state in which the base plate according to Embodiment 9 is attached to the cooler.

FIG. 27 is another cross-sectional view of the state in which the base plate 1i according to Embodiment 9 is attached to the cooler 7. At the convex warping part 13, force that corrects the warp is unlikely to act when the base plate 1i is fixed to the cooler 7. Accordingly, the shape of the groove 5k illustrated in FIG. 25 can be held in the state illustrated in FIG. 27 as well. Thus, the height from the cooler 7 to a bottom part of the groove 5k can be uniform, and variance in the amount of deformation of the sealing material 4 can be reduced.

In the present embodiment, the height from the cooler 7 to the bottom part of the groove 5i can be uniform in a structure having different warping shapes in mixture. Thus, variance in the amount of deformation can be reduced on the entire circumference of the sealing material 4.

Note that the technical features described in the above embodiments may be combined as appropriate.

REFERENCE SIGNS LIST 1, 1a-1i base plate, 2 substrate, 2a front-surface circuit pattern, 2b ceramic substrate, 2c back-surface circuit pattern, 3 semiconductor chip, 4 sealing material, 5, 5a-5k groove, 6 cooling water, 7 cooler, 8 fastening member, 9 through-hole, 10 center, 11 upper surface, 12 back surface, 13 convex warping part, 14 maximum warping part, 15 concave warping part, 16 stress generated part, 51a-51h bottom part, 100 semiconductor device

The invention claimed is:

1. A semiconductor device comprising:
a base plate that has an upper surface and a back surface on a side opposite the upper surface and at the back surface of which an annular groove is formed;
a substrate provided on the upper surface of the base plate; and
a semiconductor chip provided on an upper surface of the substrate, wherein
the base plate has a convex warping part that warps in a convex shape toward the upper surface side, and
a part of the groove, which is formed at the convex warping part is deeper at a position farther away from a maximum warping part having a largest warp in the convex warping part.

2. The semiconductor device according to claim 1, wherein
the groove is polygonal in a plan view, and
at least one side of the groove, which is formed at the convex warping part is deeper at a position farther away from the maximum warping part.

3. The semiconductor device according to claim 1, wherein, at the part of the groove formed at the convex warping part, a thickness between a bottom part of the groove and the upper surface of the base plate is smaller at a position farther away from the maximum warping part.

4. The semiconductor device according to claim 1, wherein
the groove is polygonal in a plan view, and
along at least one side of the groove, which is formed at the convex warping part, a depth of the groove is symmetric with respect to a center of the one side.

5. The semiconductor device according to claim 1, wherein
the groove is polygonal in a plan view,
the maximum warping part is provided at a position shifted from a center of one side of the groove, which is formed at the convex warping part, in a direction along the one side, and
along the one side, a depth of the groove largely changes at separation from the maximum warping part by a constant distance on a side on which a distance from the maximum warping part to an end part of the one side is shorter as compared to a side on which a distance from the maximum warping part to an end part of the one side is longer.

6. The semiconductor device according to claim 1, wherein a bottom part of the part of the groove formed at the convex warping part is formed as a flat surface.

7. The semiconductor device according to claim 1, wherein a bottom part of the part of the groove formed at the convex warping part is formed as a curved surface.

8. The semiconductor device according to claim 1, wherein a bottom part of the part of the groove formed at the convex warping part has a stepped shape.

9. The semiconductor device according to claim 1, wherein a part of the groove has a constant depth and has a same depth as a deepest part of the part of the groove formed at the convex warping part.

10. The semiconductor device according to claim 9, wherein the part of the groove having the constant depth is formed at a stress generated part of the base plate at which stress is generated in a direction that causes warping of the base plate in a convex shape toward the back surface side.

11. The semiconductor device according to claim 9, wherein the part of the groove having the constant depth is formed at a concave warping part of the base plate, the concave warping part warping in a convex shape toward the back surface side.

12. The semiconductor device according to claim 1, further comprising:
a sealing material housed in the groove; and
a cooler fixed to the back surface of the base plate to cover the groove.

13. The semiconductor device according to claim 1, wherein the semiconductor chip is made with a wide bandgap semiconductor.

14. The semiconductor device according to claim 13, wherein the wide bandgap semiconductors is silicon carbide, gallium-nitride-based material or diamond.

15. A semiconductor device comprising:
a base plate that has an upper surface and a back surface on a side opposite the upper surface and at the back surface of which an annular groove is formed;
a substrate provided on the upper surface of the base plate; and
a semiconductor chip provided on an upper surface of the substrate, wherein
the base plate has a concave warping part, the concave warping part warping in a convex shape toward the back surface side, and
a part of the groove, which is formed at the concave warping part, has a constant depth.

16. The semiconductor device according to claim 15, wherein the semiconductor chip is made with a wide bandgap semiconductor.

17. The semiconductor device according to claim 16, wherein the wide bandgap semiconductors is silicon carbide, gallium-nitride-based material or diamond.

18. A semiconductor device comprising:
- a base plate that has an upper surface and a back surface on a side opposite the upper surface and at the back surface of which an annular groove is formed;
- a substrate provided on the upper surface of the base plate;
- a semiconductor chip provided on an upper surface of the substrate;
- a sealing material housed in the groove; and
- a cooler fixed to the back surface of the base plate to cover the groove, wherein
- the base plate has a stress generated part at which stress is generated in a direction that warps the base plate in a convex shape toward the back surface side, and
- a part of the groove, which is formed at the stress generated part, has a constant depth.

19. The semiconductor device according to claim 18, wherein the semiconductor chip is made with a wide bandgap semiconductor.

20. The semiconductor device according to claim 19, wherein the wide bandgap semiconductors is silicon carbide, gallium-nitride-based material or diamond.

21. A method for manufacturing a semiconductor device, the method comprising:
- mounting a substrate on an upper surface of a base plate that has the upper surface and a back surface on a side opposite the upper surface and at the back surface of which an annular groove is formed;
- mounting a semiconductor chip on an upper surface of the substrate; and
- reducing warping of a concave warping part by fixing a cooler to the back surface of the base plate to cover the groove in a state in which the base plate has the concave warping part and a sealing material is housed in the groove, the concave warping part warping in a convex shape toward the back surface side,
- wherein a part of the groove, which is formed at the concave warping part, has a constant depth.

* * * * *